(12) United States Patent
Kazama

(10) Patent No.: US 7,463,041 B2
(45) Date of Patent: Dec. 9, 2008

(54) HIGH-DENSITY ELECTROCONDUCTIVE CONTACT PROBE WITH UNCOMPRESSED SPRINGS

(75) Inventor: Toshio Kazama, Nagano (JP)

(73) Assignee: NHK Spring Co., Ltd (JP)

(*) Notice: Subject to any disclaimer, the term of this patent is extended or adjusted under 35 U.S.C. 154(b) by 0 days.

(21) Appl. No.: 10/510,657

(22) PCT Filed: Apr. 16, 2003

(86) PCT No.: PCT/JP03/04839

§ 371 (c)(1),
(2), (4) Date: May 26, 2005

(87) PCT Pub. No.: WO03/087854

PCT Pub. Date: Oct. 23, 2003

(65) Prior Publication Data
US 2005/0237070 A1 Oct. 27, 2005

(30) Foreign Application Priority Data
Apr. 16, 2002 (JP) .............................. 2002-113691

(51) Int. Cl.
G01R 31/02 (2006.01)
(52) U.S. Cl. ...................................... 324/754; 324/761
(58) Field of Classification Search ......... 324/754–762, 324/72.5; 439/482, 824
See application file for complete search history.

(56) References Cited

U.S. PATENT DOCUMENTS 4,029,375 A * 6/1977 Gabrielian ................... 439/66
4,508,405 A * 4/1985 Damon et al. ............... 439/260

(Continued)

FOREIGN PATENT DOCUMENTS

CN 338522 8/1998

(Continued)

OTHER PUBLICATIONS

English Language Abstract, Japanese Publication No. 8-160075, Published Jun. 21, 1996, 1 p.

(Continued)

Primary Examiner—Vinh P Nguyen
(74) Attorney, Agent, or Firm—Alma P. Levy; MacPherson Kwok Chen & Heid LLP

(57) ABSTRACT

A holder 1 is formed by laminating support members 3, 4 and 5 and passing holder holes 2 through them. A pair of needle members 9 and 10 are provided on either end of the coil spring 8. Each of the needle members 9 on one side is prevented from coming off by one of the support members 3. The length L between the flange portion 9b received in a large diameter hole 2b of the holder hole and the tip of the needle portion 10a is made substantially equal to the depth D of the large diameter hole 2b of the holder 1. Because the coil springs are thus placed substantially in an unstressed state, when at least one of the needle members is prevented from projecting from a corresponding end of the holder hole, the part that prevents the needle members from coming off is not subjected to a compressive load of the coil springs. Therefore, even when the holder is given with a small thickness, warping or deflecting of the holder can be avoided, and material having a small coefficient of thermal expansion such as ceramic material can be used for the holder.

20 Claims, 5 Drawing Sheets

U.S. PATENT DOCUMENTS

| | | | |
|---|---|---|---|
| 4,528,500 A * | 7/1985 | Lightbody et al. | 324/537 |
| 5,225,777 A * | 7/1993 | Bross et al. | 324/754 |
| 5,395,249 A * | 3/1995 | Reynolds et al. | 439/65 |
| 5,410,260 A | 4/1995 | Kazama et al. | |
| 5,414,369 A * | 5/1995 | Kazama | 324/758 |
| 5,825,616 A * | 10/1998 | Howell et al. | 361/684 |
| 5,945,837 A * | 8/1999 | Fredrickson | 324/761 |
| 5,955,888 A * | 9/1999 | Frederickson et al. | 324/761 |
| 6,034,532 A * | 3/2000 | Tarzwell | 324/761 |
| 6,095,823 A * | 8/2000 | Banks | 439/66 |
| 6,190,181 B1 * | 2/2001 | Affolter et al. | 439/70 |
| 6,204,680 B1 * | 3/2001 | Swart et al. | 324/761 |
| 6,556,033 B1 * | 4/2003 | Kazama | 324/761 |
| 6,636,057 B1 * | 10/2003 | Uchikura | 324/754 |
| 6,642,728 B1 * | 11/2003 | Kudo et al. | 324/754 |
| 6,900,651 B1 | 5/2005 | Kazama | |

FOREIGN PATENT DOCUMENTS

| | | |
|---|---|---|
| EP | 1 113 274 A1 | 7/2001 |
| JP | 06-148236 | 5/1994 |
| JP | 07-57808 | 3/1995 |
| JP | 8-160075 | 6/1996 |
| JP | 08-213088 | 8/1996 |
| JP | 9-121007 | 5/1997 |
| JP | 10-214649 | 8/1998 |
| JP | 2000-329790 | 11/2000 |
| JP | 2001-167831 | 6/2001 |
| JP | 2001-223247 | 8/2001 |
| JP | 2000-158053 | 5/2002 |
| JP | 2002-202321 | 7/2002 |
| WO | WO 00/03250 | 1/2000 |
| WO | WO 00/03251 | 1/2000 |
| WO | WO 02/075329 A2 | 9/2002 |

OTHER PUBLICATIONS

English Language Abstract, Japanese Publication No. 2001-223247, Published Aug. 17, 2001, 1 p.

Microfilm of the specification and drawings annexed to the request of Japanese Utility Model Application No. 54286/1987 (Laid-open No. 161366/1988) (NHK Spring Co., Ltd.), Oct. 21, 1988.

* cited by examiner

HIGH-DENSITY ELECTROCONDUCTIVE CONTACT PROBE WITH UNCOMPRESSED SPRINGS

TECHNICAL FIELD

The present invention relates to an electroconductive contact probe, and in particular to a contact probe which is suitable for testing highly integrated semiconductor devices and other test objects having highly densely arranged points to be accessed.

BACKGROUND OF THE INVENTION

A contact probe of this type typically comprises a holder in the form of a plate member defining a plurality of holder holes passed across the thickness of the holder, a compression coil spring received in each holder hole and a pair of needle members connected to either axial end of the compression coil spring. An electroconductive contact probe of this type is typically used between an object to be tested and a circuit board of a testing device.

In case of a contact probe having two moveable ends, the two needle members for each coil spring project from the corresponding sides of the holder and are prevented from coming out beyond a certain limit by shoulders or the like formed in the holder. In case of a contact probe having only one moveable end, one of the needle member is prevented from coming off in a similar manner while the other needle member abuts corresponding pad of a circuit board which is attached to the corresponding side of the holder.

In either case, to the end of obtaining a favorable resilient force from each coil spring, the coil spring is installed in a prestressed state. By so doing, changes in the resilient force in relation with the retracting stroke of the corresponding needle member can be minimized.

However, the inventor has discovered that, as the number of contact units (each including a compression coil spring and a pair of needle members provided on either axial end of the coil spring) in each contact probe increases to meet the need to test highly densely arranged terminals or pads of modern semiconductor devices, the combined spring force of the coil springs in the contact probe may become so great that it becomes increasingly difficult to provide an adequate mechanical strength to the holder. Because each contact unit is very small, the spring force of each contact unit may be extremely small, but the number of contact units is so great in some of the contact probes for testing advanced semiconductor devices that the combined spring force may become very significant.

In particular, because at least one of the needle members of each contact unit is required to be prevented from coming off by a shoulder or the like formed in the holder hole, such a shoulder or the like is constantly subjected to the preloading of the coil spring. Thus, the combined spring load acts upon the shoulder and tends to push one part of the holder away from another.

When the compression load of the coil springs is large enough, the holder member typically made by a plurality of layered support members subjected to this compression load may warp, deflect or otherwise deform. This would give rise to such problems as the loss of precision in the position of the free ends of the needle members (contact positions) and an increased resistance to the movement of the needle members. Such problems could be avoided by increasing the thickness of the corresponding support member.

However, as the frequency of the signal for testing the test objects becomes higher, the contact probe is required to be adapted to such high frequency signals. For instance, the total length (the length of the path for the test signal) is desired to be minimized. This can be accomplished by reducing the total thickness of the holder (axial length of each electroconductive contact unit) by reducing the thickness of each support member, but the reduced thickness of the support member means a reduced mechanical strength, and compounds the problem.

When a burn-in test is conducted on a semiconductor device by applying a voltage for a prolonged period of time (from a few hours to tens of hours) at a high temperature environment (approximately 150° C.), it is desirable to use an insulating material having a relatively low coefficient of thermal expansion such as ceramics for the support members. However, when the support members are made of brittle material such as ceramics, they could be damaged when the spring load is great. Therefore, in some cases, ceramic material cannot be used for the support members of an electroconductive contact probe which is required to have a small thickness. Plastic material may be used for the support members when the contact unit is intended to be used in a room temperature environment, but the support members may deform under the load even in such cases.

BRIEF SUMMARY OF THE INVENTION

In view of such problems of the prior art, a primary object of the present invention is to provide a contact probe which is suitable for testing highly integrated semiconductor devices and other test objects having highly densely arranged points to be accessed.

A second object of the present invention is to provide a contact probe which is simple in structure and economical to manufacture.

A third object of the present invention is to provide a contact probe which can be constructed as a highly thin structure.

A fourth object of the present invention is to provide a contact probe whose holder may be made of material which may lack in favorable mechanical properties but are desirable in other regards.

According to the present invention, at least most of the objects can be accomplished by providing an electroconductive contact probe, comprising: a holder member defining a plurality of holder holes passed across a thickness of the holder member; an electroconductive coil spring received in each of the holder holes, a pair of electroconductive contact members provided on either axial end of the coil spring; an engagement portion provided in each of the holder holes for preventing at least one of the contact members from coming off from the holder hole; the electroconductive coil springs being installed in the holder holes so as to be substantially unstressed under a rest condition of the contact probe.

According to this arrangement, because the electroconductive coil spring and electroconductive contact means are installed in the holder hole with the coil spring placed substantially in an unstressed state, when at least one of the electroconductive contact means is prevented from projecting from a corresponding end of the holder hole, the engagement portion that prevents the electroconductive contact member from coming off is not subjected to a compressive load of the coil spring. Therefore, even when the holder is given with a small thickness, warping or deflecting of the holder can be avoided as opposed to the prior art, and insulating material having a small coefficient of thermal expansion such as ceramic material can be used for the holder.

The contact members on either axial end of each coil spring may both comprise needle members. In such a case, a pair of engagement portions may be provided in either axial end of each holder hole to prevent both of the needle members from coming off from the holder hole or, alternatively, an engagement portion may be provided in only one of two axial ends of each holder hole to prevent the corresponding needle member from coming off from the holder hole. In either case, each engagement portion may consist of a shoulder defined in each holder hole. If the holder member comprises a plurality of layered support members, the shoulder may be conveniently defined between adjoining two of the support members having holder holes which are coaxial to each other but having different diameters formed therein.

According to a preferred embodiment of the present invention, the contact member on one of the axial ends of each coil spring comprise a needle member, and the contact member on the other axial end of the coil spring consists of a coil end of the coil spring, the engagement portion being provided in each holder hole only to prevent the needle member from coming off. This arrangement reduces the number of components and the amount of assembly work, and thereby contributes to the reduction of the manufacturing cost.

Typically, a circuit board of a testing device is attached to one side of the holder, and the contact members of the corresponding side engage the pads of the circuit board. Therefore, the contact members on this side are not required to be prevented from coming off and an engagement portion may not be provided in each holder hole as far as this side is concerned.

If the free end of the electroconductive contact members on the side of the contact probe not provided with an engagement portion are flush with the outer surface of the holder, by inspecting the projecting lengths of the contact members from the outer surface of the holder in the installed state, any defects in the assembly can be readily detected.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
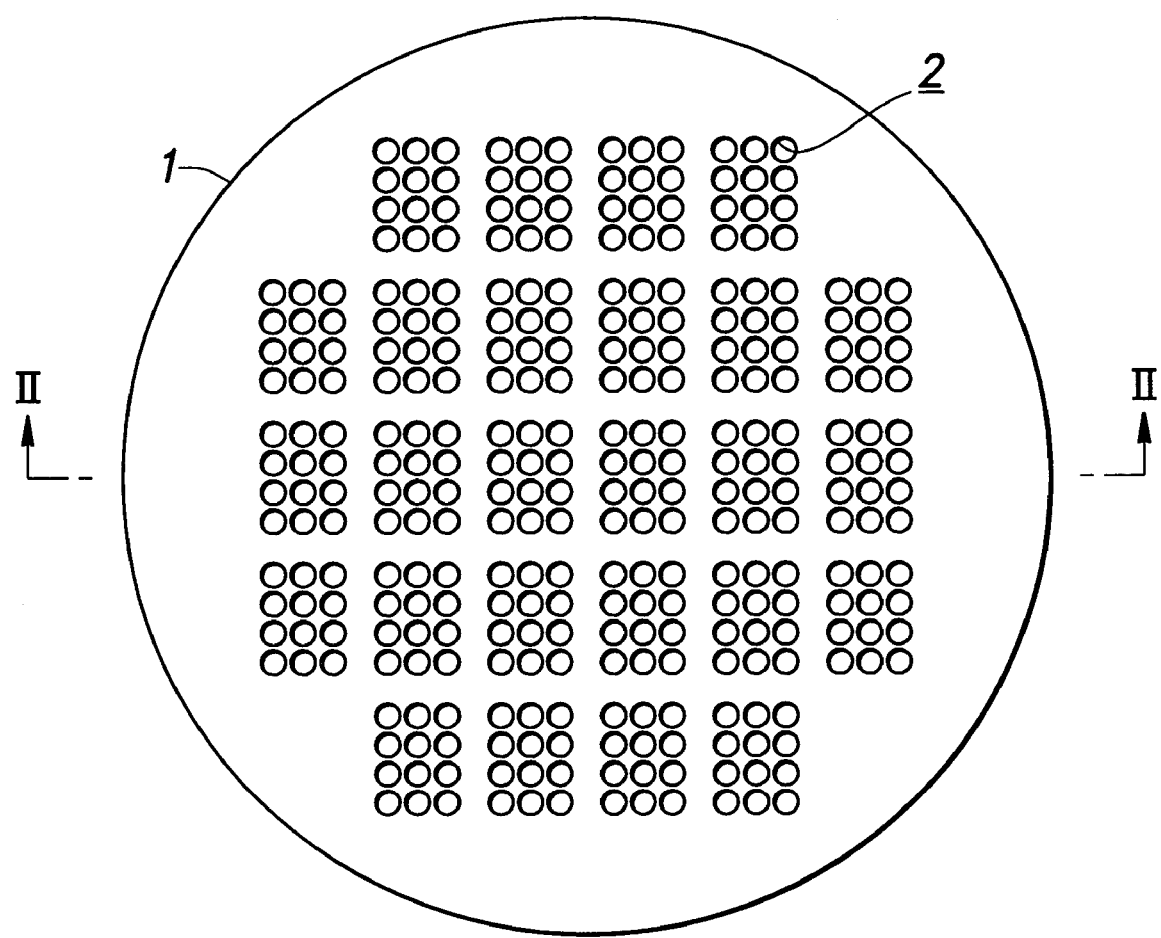
FIG. 1 is a plan view of a contact probe holder for use in a contact probe unit embodying the present invention.

FIG. 1 is a plan view of a holder for electroconductive contact units in a contact probe embodying the present invention. When the object to be tested consists of an 8-inch wafer, for instance, the holder 1 may consist of a disk having a diameter of eight inches (approximately 200 mm). An 8-inch wafer typically produces tens to hundreds of semiconductor chips. A 12-inch wafer (approximately 300 mm) typically produces thousands of semiconductor chips.

Referring to FIG. 1, the holder 1 for an electroconductive contact probe is circular in shape in plan view similarly as the wafer that is to be tested, and is provided with a plurality of holder holes 2 for receiving a plurality of electroconductive contact units at positions that correspond to the electrodes of the chips formed in the wafer as is the case with the prior art. In the drawing, the holder holes 2 are illustrated in a somewhat exaggerated manner, and are smaller in number than actually are.

Figure 2:
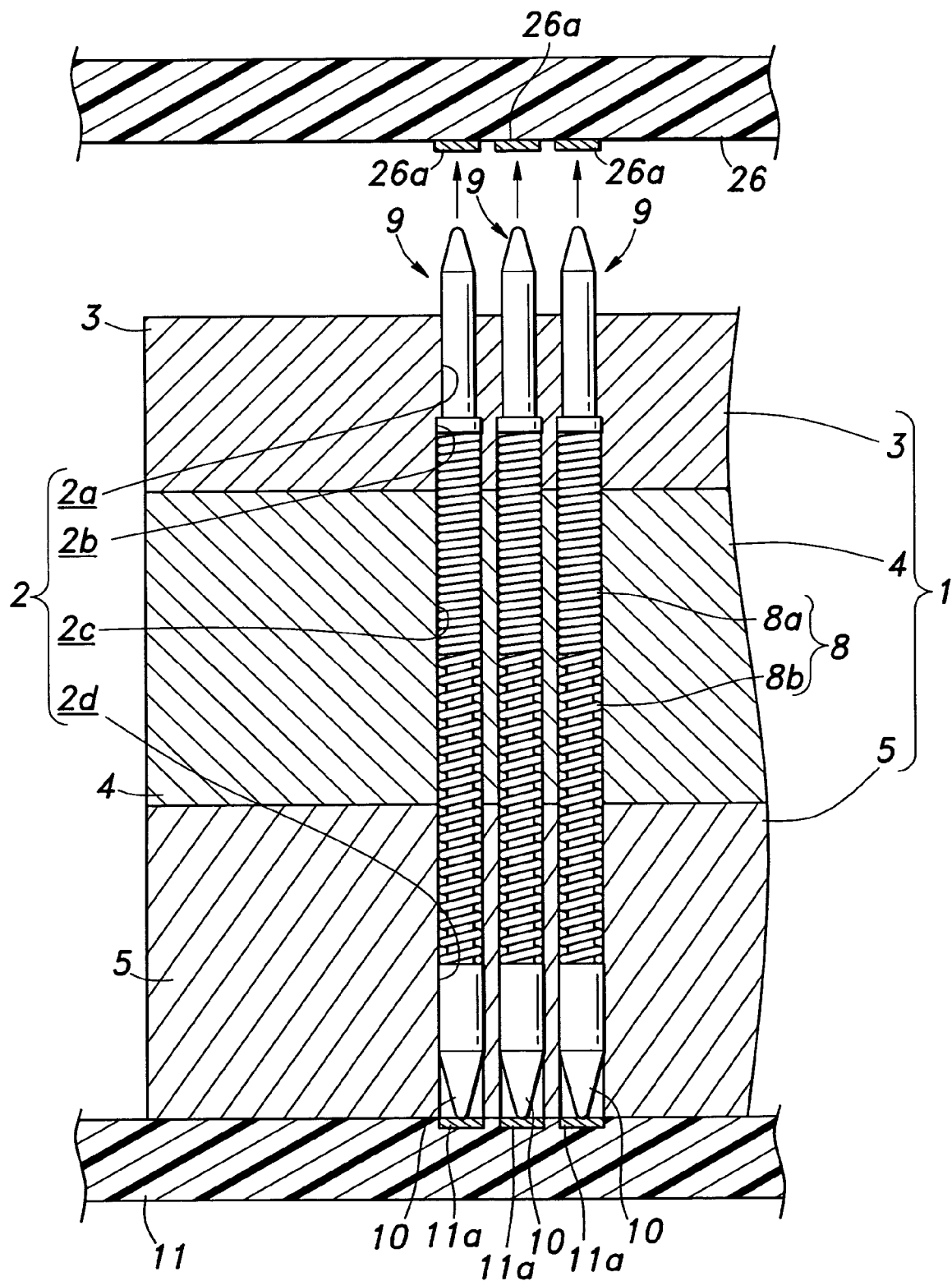
FIG. 2 is a fragmentary longitudinal sectional view of the contact probe unit taken along line II-II of FIG. 1.

FIG. 2 is a fragmentary longitudinal sectional view taken along line II-II of FIG. 1 showing exemplary electroconductive contact units embodying the present invention. As shown in FIG. 2, three support members 3, 4 and 5 in the form of plate members having a same shape as seen in the plan view of FIG. 1 are layered as an upper, middle and lower layer so as to form a three-layered holder for an electroconductive contact probe.

The support members 3, 4 and 5 may be all made of a same material such as plastic material that allows the holder holes 2 to be formed at high precision or ceramic material that is highly resistant to heat. Metallic materials and semiconductor materials may also be used if necessary insulation is made by insert molding, coating or deposition of insulating material in required places. The support members 3, 4 and 5 are all provided with a conformal circular disk shape, and are held in position in the laminated state illustrated in FIG. 2 by using threaded bolts or the like not shown in the drawing. The use of threaded bolts for securing the laminated assembly allows the assembly to be taken apart and reassembled with ease for maintenance and other purposes.

Figure 3:
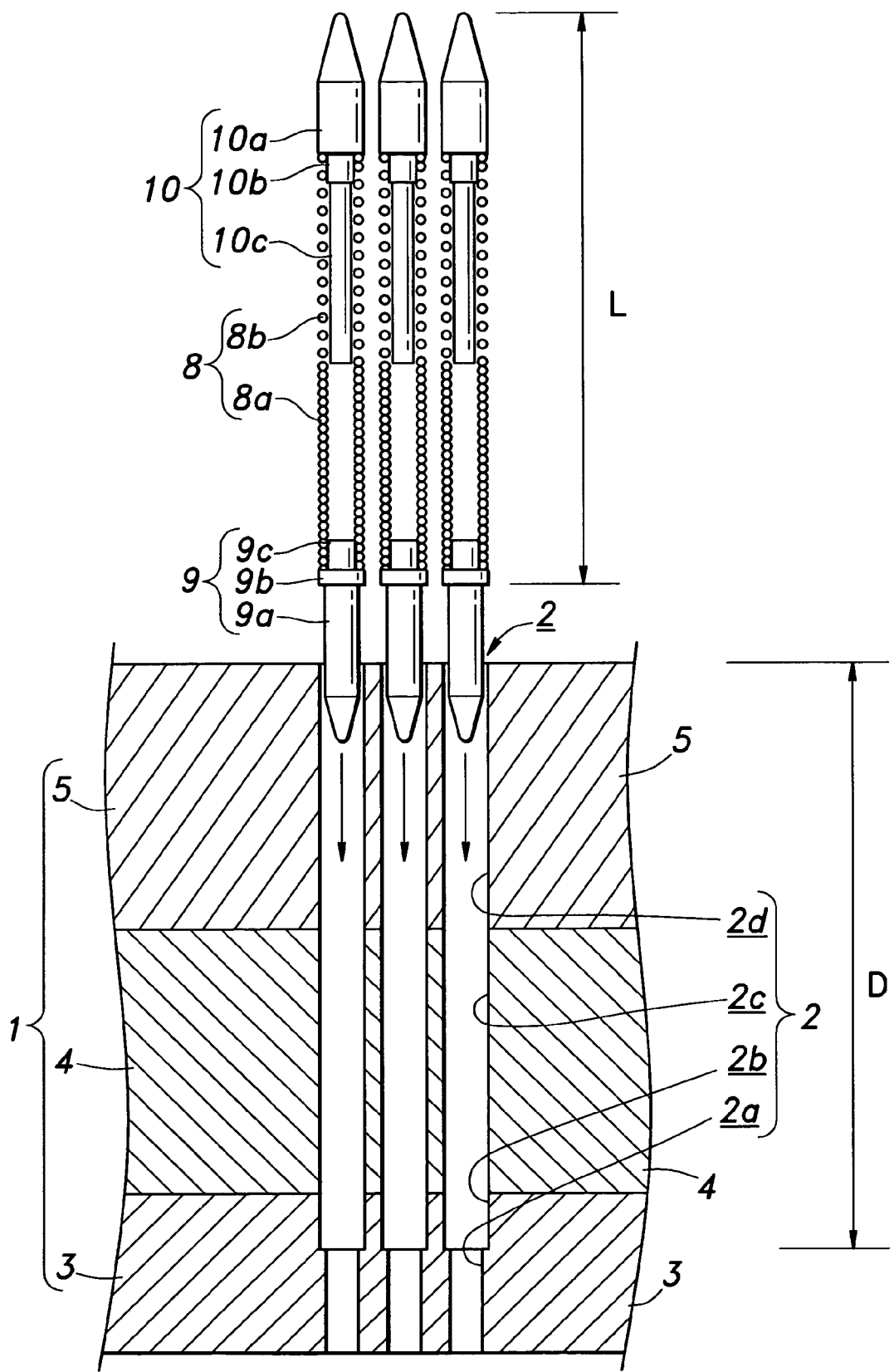
FIG. 3 is a view showing the mode of assembling the coil springs and needle members in the contact probe support members.

Referring to FIGS. 2 and 3, one of the outer (upper in FIG. 2) support member 3 is formed with stepped diameter holes each including a small diameter hole 2a and a large diameter hole 2b coaxially disposed to each other, and the other support members 4 and 5 are formed with straight holes 2c and 2d having a same diameter as the large diameter hole 2b. Each holder hole 2 thus consists of the corresponding stepped diameter hole 2a and 2b and the corresponding straight holes 2c and 2d.

Referring to FIG. 3, the conductive part of each contact unit comprises an electroconductive coil spring 8 and a pair of electroconductive contact members consisting of electroconductive needle members 9 and 10 provided on either end of the coil spring 8 with their free ends directed away from each other. One of the needle members 9 (or the lower needle member in FIG. 3) comprises a needle portion 9a having a pointed end that is directed downward in FIG. 3, a flange portion 9b formed at the base end of the needle portion 9a and having an enlarged diameter as compared with the needle portion 9a, and a boss portion 9c projecting from the flange portion 9b away from the needle portion 9a (upward in FIG. 3) all of which are disposed coaxial to one another. The other needle member 10 (or the upper needle member in FIG. 3) comprises a needle portion 10a having a pointed end that is directed upward in FIG. 3, a boss portion 10b formed at the base end of the needle portion 10a and having a smaller diameter than the needle portion 10a, and a stem portion 10c projecting from the boss portion 10b away from the needle portion 10a (downward in FIG. 3) all of which are again disposed coaxial to one another.

The coil spring 8 comprises a closely wound portion 8a in a lower part thereof and a coarsely would portion 8b in an upper part thereof as seen in FIG. 3. The boss portion 9c of one of the needle member 9 fits into the coil end defined by the closely wound portion 8a, and the boss portion 10b of the other needle member 10 fits into the other coil end defined by the coarsely wound portion 8b. These boss portions 9c and 10b may be engaged by the corresponding ends of the coil spring 8 by virtue of the winding or wrapping force of the coil spring or by solder. When solder is used, the fit between the boss portions 9c and 10b and the corresponding coil ends may be a loose one.

When the coil spring 8 and electroconductive needle members 9 and 10 are installed in the corresponding holder hole with the coil spring 8 left unstressed and extending by the natural length thereof, the free end of the stem portion 10c substantially coincides with the end of the closely wound portion 8a adjoining the coarsely wound portion 8b. Thereby, as the coil spring 8 is compressed and curves during use for testing, the closely wound portion 8a comes into contact with the stem portion 10c so that the electric signal conducted between the two needle members 9 and 10 is allowed to flow through the closely wound portion 8a and stem portion 10c without flowing through the coarsely would portion 8b. Thereby, the electric signal is allowed to flow axially or straight between the two needle members 9 and 10, and this makes the contact unit highly desirable for the testing of new generation chips involving high frequencies.

The integrally joined assembly of the coil spring 8 and electroconductive needle members 9 and 10 is installed in the support members 3, 4 and 5 by introducing it into the holder hole 2 as indicated by an arrow in FIG. 3. The contact unit may be used either in an inverted orientation as illustrated in FIG. 3 or in the normal orientation illustrated in FIG. 2. In either case, when installing the assembly of the coil spring 8 and electroconductive needle members 9 and 10 as illustrated in FIG. 3, the assembly is prevented from coming off from the holder hole 2 by the flange portion 9b of one of the needle members 9 being engaged by the shoulder defined between the small diameter hole 2a and large diameter hole 2b. Thus, the shoulder defined between the small diameter hole 2a and large diameter hole 2b and the flange portion 9b prevents the assembly from coming off in one direction (downward direction in FIG. 3).

In the installed state illustrated in FIG. 2, the circuit board 11 of the testing device is attached to the lower side of the contact probe, for instance by using threaded bolts with the stepped diameter hole 2a and 2b of the holder 1 facing up and the straight holes 2c and 2d of the holder 1 facing down. The circuit board 11 is provided with terminals 11a at positions corresponding to the needle members 10. In the installed state illustrated in FIG. 2, the needle portion 10a of each needle member 10 engages the corresponding terminal 11a, and this prevents the assembly consisting of the coil spring 8 and needle members 9 and 10 from coming off from the holder hole 2 in the other direction.

According to the present embodiment, in the installed state illustrated in FIG. 2 or under the rest condition of the contact probe 1, the free end 10a of each needle member 10 barely engages the corresponding terminal 11a of the circuit board 11 or, in other words, the coil spring 8 is in an unstressed state. For instance, with respect to each contact unit integrally combining the coil spring 8 and needle members 9 and 10 as illustrated in FIG. 3, when no load is applied to the coil spring 8, the length L between the flange portion 9b and the tip of the needle member 10a is substantially equal to the depth D of the large diameter hole 2b, 2c and 2d of the holder 1.

Because the terminals 11a of the circuit board 11 attached to the holder 1 are substantially flush with the lower surface of the holder 1 in the drawing, the part of each contact unit extending between the flange portion 9b and the needle portion 10a is accommodated in the large diameter hole 2b, 2c and 2d having the depth D. Also, because the length L and depth D are substantially equal to each other, substantially no significant load is applied to the coil spring 8 in the assembled state illustrated in FIG. 2. Therefore, the support member 3 remote from the circuit board 11 would not be pushed up by the spring force of the coil spring 8, and warping or deflecting of the support member 3 can be avoided even when the thickness of the support member 3 is small, for instance in the order of 1 mm, as opposed to the conventional arrangement. For this reason, this embodiment is highly beneficial for use in larger holders (having a diameter in the range of 200 to 300 mm).

It may be arranged such that the tip of every one of the needle portions 10a is accommodated in the corresponding large diameter hole 2b. In other words, the length L may be slightly small than the depth D. Alternatively, to avoid the influences of the variations in the length L owing to the variations in the mode of connection between each coil spring 8 and the corresponding needle member 10 and/or the variations in the height of the terminals or the points on the object to be accessed, the length L may be slightly greater than the depth D so that the needle portion 9a of each needle member slightly projects from the holder hole, and favorably accommodate such variations.

Thus, the thickness of the support member 3 can be minimized. If desired, ceramic material or other insulating material having a low coefficient of thermal expansion can be used for the support member 3. Ceramic material is generally brittle, but the structure of the present invention can prevent the support member 3 made of such material from cracking, chipping or being otherwise damaged. By using similar material for the other support members 4 and 5, the contact probe can be safely used for conducting burn-in tests which involve application of voltages under high temperature environments (approximately 150° C.) for a prolonged periods of time (from few hours to tens of hours). In short, because the requirement of mechanical strength for the support members can be lowered, the freedom in the selection of the material for the support member is increased.

Preferably, the relationship between the length L and depth D may be selected in such a manner that the projecting length of the needle portion 10a out of the holder 1 (toward the circuit board 11) may be made as small as possible in the installed state of each contact unit consisting of the coil spring 8 and needle members 9 and 10 or the needle portion 10a barely touches the circuit board 11 with the needle portion 10a even slightly retracted from the outer surface of the holder 1. In any event, it is desirable to minimize the pressure (spring load) of the needle portion 10a on the terminal 11a when the circuit board 11 is assembled. Also, by inspecting the projecting lengths of the needle portions 10a from the outer surface of the holder 1 with the coil springs 8 and needle members 9 and 10 installed in the holder 1, any defects in the assembly can be readily detected, and the state of the coil springs 8 and needle members 9 and 10 can be easily verified.

Referring to FIG. 2, as the contact probe is applied to a wafer 26 that is to be tested as indicated by the arrow in the drawing with the needle portions 9a of the upper needle members 9 projecting upward, the needle portions 9a come into contact with the corresponding electrodes 26a, and the needle portions 9a and 10a eventually come into resilient engagement with the corresponding electrodes 26a and terminals 11a. At that time, as the upper needle member 9 are pushed into the holder holes by a certain stroke, and this produces a resilient reaction from the coil springs that is adequate for establishing required electric contacts between the contact probe and wafer 26 and between the contact probe and circuit board 1. Thus, a prescribed electric test can be conducted on the wafer. Under this condition, the spring load of the coil springs 8 are applied only to the circuit board 11 and wafer 26, and not to the support members 3, 4 and 5.

Figure 4:
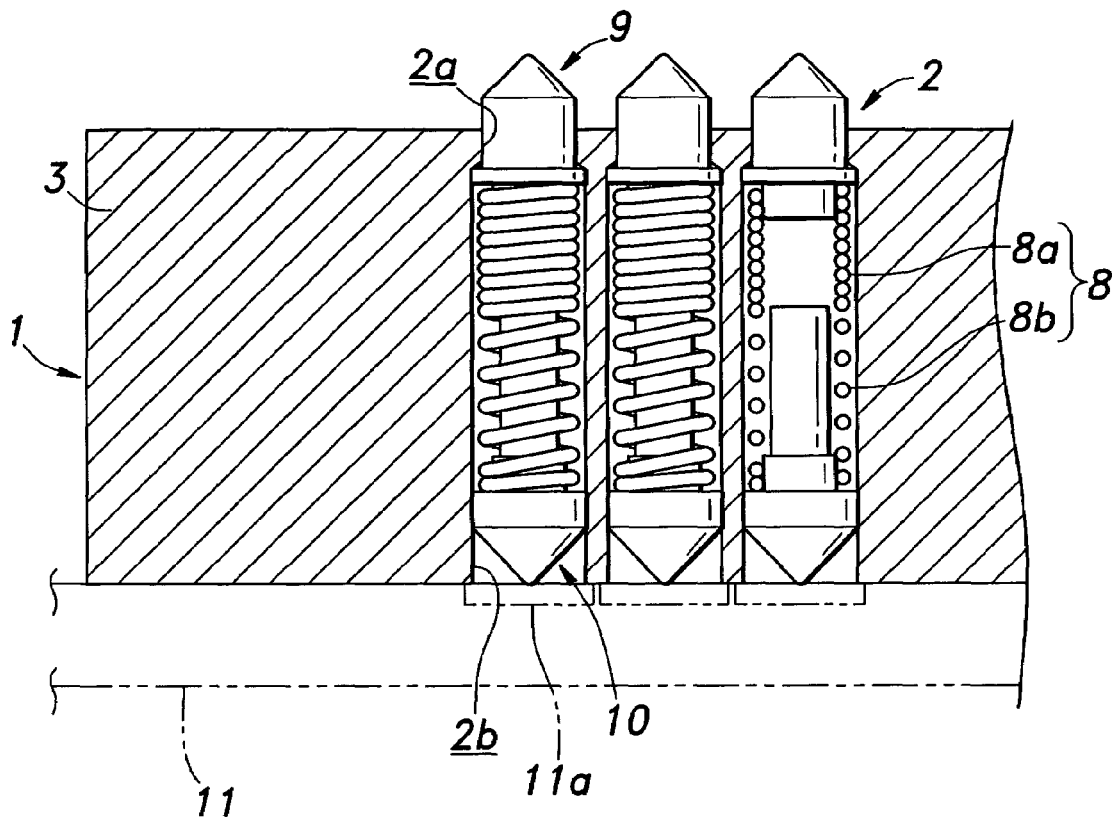
FIG. 4 is a view similar to FIG. 2 showing a second embodiment of the present invention.

In the foregoing embodiment, the contact probe holder was provided with a three-layered structure including three support members 3, 4 and 5, but may also consist of a single support member depending on the size and pitch of the holder holes. Such a single layered structure is illustrated in FIG. 4. The support member 3 shown in FIG. 4 may be similar to the support member 3 of the previous embodiment, and the parts corresponding to those of the previous embodiment are denoted with like numerals without repeating the description of such parts.

The contact probe holder illustrated in FIG. 4 is provided with holder holes 2 each defined by a stepped diameter hole formed in a single support member 3, and a coil spring 8 and a pair of electroconductive needle members 9 and 10 are received in each holder hole 2. When no significant stroke is required for the needle members 9, the coarsely wound portion 8b of each coil spring 8 is not required to be so long, and the holder 1 may consist of a single-layered structure including only one support member 3. In such a case, the thickness of the holder 1 can be reduced even further.

Figure 5:
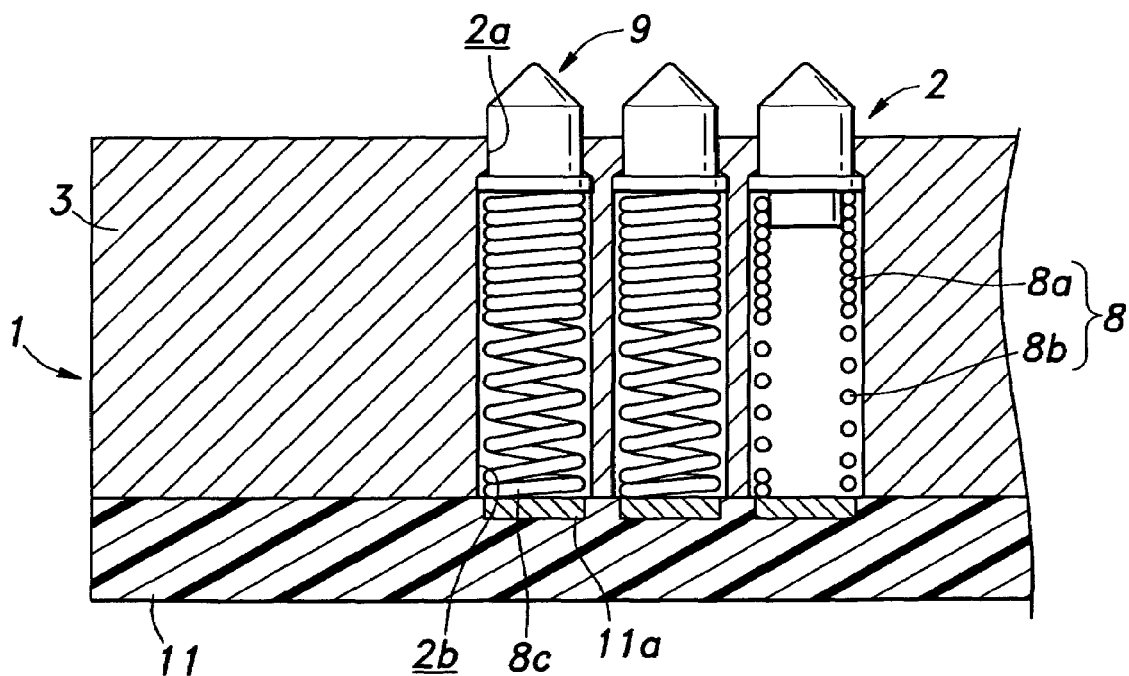
FIG. 5 is a view similar to FIG. 5 showing a third embodiment of the present invention.

Electroconductive contact members on either end of each coil spring 8 consisted of a pair of needle members 9 and 10 in the foregoing embodiments, but the contact members on one end of each coil spring 8 facing the circuit board 11 may consist of a coil end 12 (the coil end of the coarsely wound portion in the illustrated embodiment) as illustrated in FIG. 5 so as to apply this coil end 12 to the corresponding terminal 11a. This reduces the number of needle members that are required, and contributes to the reduction in the manufacturing cost by minimizing the number of component parts and the amount of the required assembly work.

Figure 6:
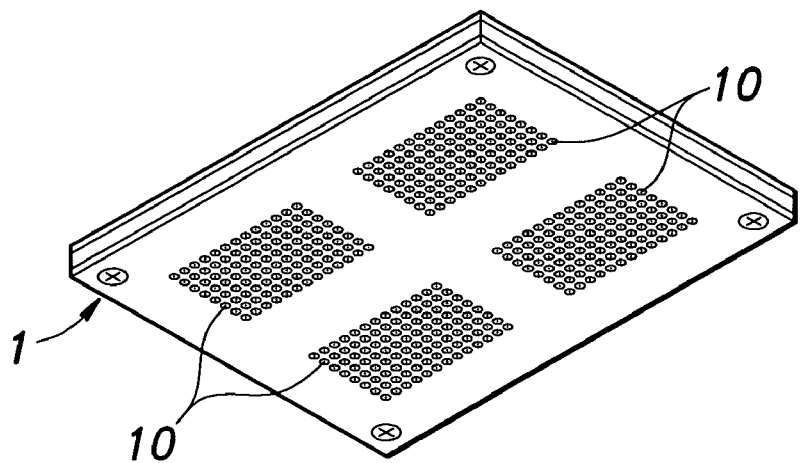
FIG. 6 is a schematic perspective view of a contact probe having needle members that are densely populated (fourth embodiment)

In an electroconductive contact probe having a structure described above, because the coil springs 8 are not stressed in the installed state as mentioned earlier, a particularly favorable advantage can be gained when a large number of needle members 10 are densely arranged so as to match with the electrodes of the chips that are to be tested as illustrated in FIG. 6. For instance, when a semiconductor package substrate is to be tested, it may contain 3,000 or more pads (terminals or the like) in each square centimeter, and even though the spring force of each spring may be extremely small, the combined spring force may be so significant that the holder in the form of a plate member could warp under such a load. However, in the contact probed described above, as each coil spring provides substantially no spring load in the installed state, the total load is substantially zero, and the warping or other deformation of the holder can be avoided.

Figure 7:
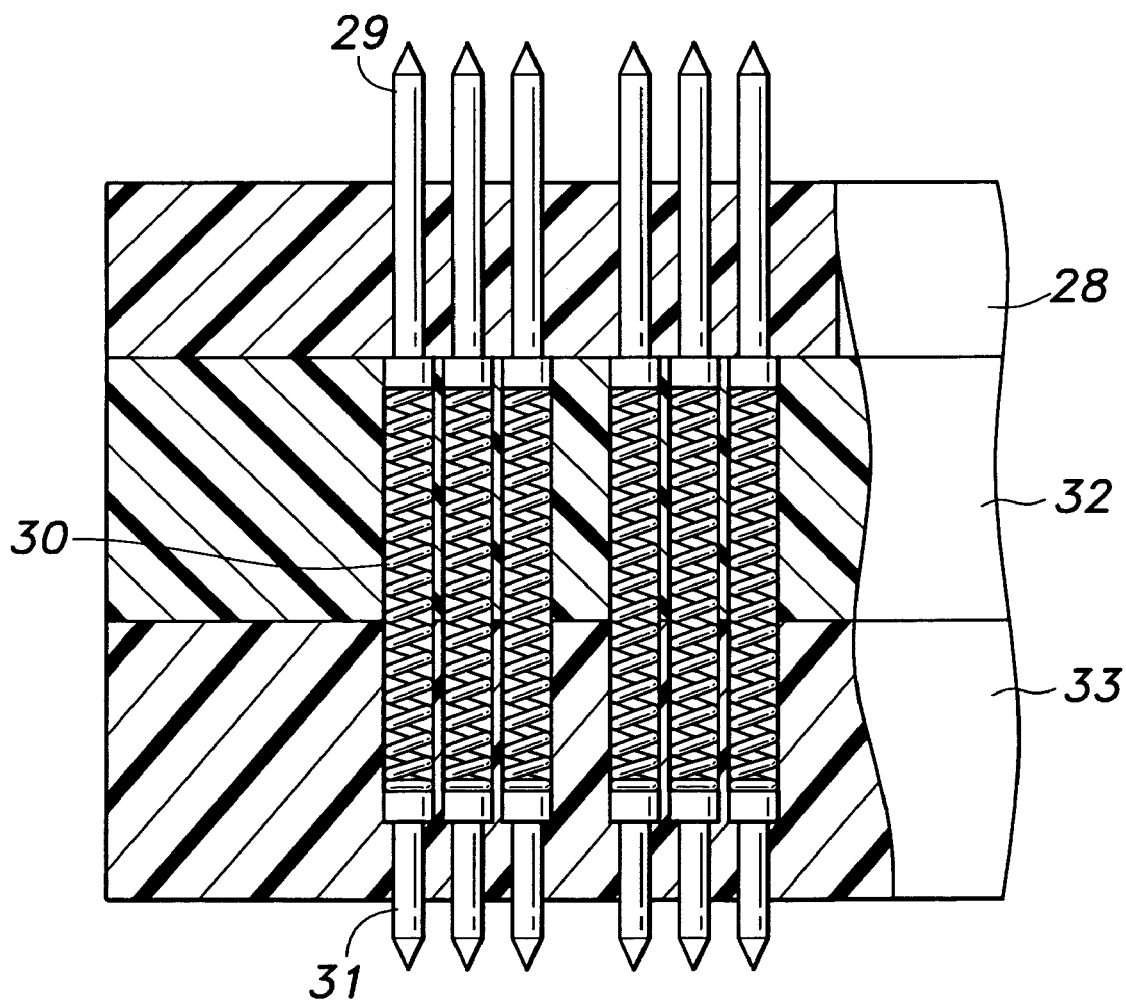
FIG. 7 is a fragmentary longitudinal sectional view showing a fifth embodiment of the present invention.

FIG. 7 shows a part of a contact probe having two moveable ends. Each of the electroconductive contact units shown in the drawing is provided with an electroconductive compression coil spring 30 and a pair of electroconductive needle members 29 and 31 adjoining either end of each coil spring, and thereby provides two moveable ends. The holder for supporting these units is formed by laminating three plastic support members 28, 32 and 33. The upper support member 28 is provided with small diameter holes each receiving one of the needle members 29 of the corresponding contact unit in an axially slidable manner so as to move its free end into and out of the holder, and the corresponding coil spring is received in a large diameter hole provided in the middle support member 32 and a large diameter part of a stepped diameter hole provided in the lower support member 33. The other needle member 31 is slidably received in a small diameter portion of the stepped diameter hole provided in the lower support member so as to move its free end into and out of the holder. The upper needle member 29 is provided with a flange portion that is received in the large diameter hole of the middle support member 32 so as to prevent the lower needle member 29 from coming off from the holder.

In the illustrated installed state, the compression coil springs 30 placed under an unstressed state. Therefore, the coil springs 30 would not apply a force that tends to push the upper and lower support members 28 and 33 away from each other. When the two ends of the contact probe are applied to an object to be tested and a circuit board of a testing device, the compression springs are compressed between these two external parts, and the desired resilient engagement force is produced in each point of contact.

This embodiment therefore minimizes the stress that is applied to the holder. Furthermore, placing the compression coil springs 30 under an unstressed condition additionally provides the benefit of simplifying the assembly process. The assembling of the contact probe requires the needle members 29 and 31 and compression coil springs 30 to be placed in the corresponding holder holes before joining the support members 28, 32 and 33 to one another. If the coil springs 30 were prestressed in the installed state, the support members 28, 32 and 33 must be joined to one another against the combined spring force of the compression coil springs, and this would significantly impairs the simplicity of the assembly work. On the other hand, according to the illustrated embodiment, there is no need to oppose the spring force when joining the support members 28, 32 and 33, and this simplifies the assembly work.

In the arrangements described above, because each contact unit comprising an electroconductive coil spring and electroconductive contact members is installed in the corresponding holder hole with the coil spring placed substantially in an unstressed state, when at least one of the electroconductive contact members is prevented from projecting from a corresponding end of the holder hole by a part of the holder, the part that prevents the electroconductive contact member from coming off is not subjected to the compressive load of the coil spring. Therefore, even when the holder is made of a thin plate member and/or is not provided with favorable mechanical properties, warping, deflecting or breaking of the holder can be avoided as opposed to the prior art, and materials having a small coefficient of thermal expansion and other desired material properties such as ceramic material can be safely used for the holder. Therefore, in such a case, the contact probe can be safely used for conducting burn-in tests which involve application of voltages under high temperature environments (approximately 150° C.) for a prolonged periods of time (from few hours to tens of hours) even when it is formed as a highly compact unit.

When a semiconductor package substrate is to be tested, it may contain 3,000 or more pads (terminals or the like) in each square centimeter, and the combined spring force may be significant even though the spring force of each spring may be extremely small so that the holder in the form of a plate member could warp under such a load. However, in the contact probe of the present invention, as each coil spring provides substantially no spring load in the installed state, the total load is substantially zero, and the warping or other deformation of the holder can be avoided.

In particular, if the contact units are installed in the corresponding holder holes in such a manner that the free ends of the electroconductive contact members on one side of the holder are substantially flush with the outer surface of the holder, by inspecting the projecting lengths of the contact members from the outer surface of the holder in the installed state, any defects in the assembly can be readily detected.

The electroconductive contact members on one side of the holder may each consist of a coil end of the electroconductive coil spring. Thus, it may be that one of the contact members consists of a needle member which is joined with the coil spring while the other contact member consists of a coil end. This arrangement reduces the number of components and the amount of assembly work, and thereby contributes to the reduction of the manufacturing cost.

Although the present invention has been described in terms of preferred embodiments thereof, it is obvious to a person skilled in the art that various alterations and modifications are possible without departing from the scope of the present invention which is set forth in the appended claims.

The invention claimed is:

1. An electroconductive contact probe, comprising:
a holder member comprising a plurality of layers of support members and defining a plurality of holder holes passed across a thickness of said holder member;
an electroconductive coil spring received in each of said holder holes, each electroconductive spring having a natural length in an uncompressed state;
an electroconductive contact member provided on either axial end of said coil spring;
an engagement portion provided in each of said holder holes for preventing at least one of said contact members from coming off from said holder hole and allowing a certain length of said one contact member projecting out of the corresponding holder hole;
said electroconductive coil springs being installed in said holder holes such that each electroconductive coil spring extends by its natural length under a rest condition of said contact member.

2. An electroconductive contact probe according to claim 1, wherein said contact members on either axial end of each coil spring comprise needle members.

3. An electroconductive contact probe according to claim 2, wherein a pair of engagement portions are provided in either axial end of each holder hole to prevent both of said needle members from coming off from said holder hole.

4. An electroconductive contact probe according to claim 2, wherein an engagement portion is provided in only one of two axial ends of each holder hole to prevent the corresponding needle member from coming off from said holder hole.

5. An electroconductive contact probe according to claim 1, wherein said contact member on one of said axial ends of each coil spring comprises a needle member, and the contact member on the other axial end of said coil spring consists of a coil end of said coil spring, said engagement portion being provided in each holder hole only to prevent said needle member from coming off.

6. An electroconductive contact probe according to claim 1, wherein said engagement portion is provided in each of said holder holes for preventing only one of said contact members for each of said coil springs from coming off from said holder hole, and the other contact member is installed substantially flush with the outer surface of the holder member.

7. An electroconductive contact probe according to claim 1, wherein said engagement portion comprises a shoulder defined in each holder hole.

8. An electroconductive contact probe according to claim 7, wherein said shoulder is defined between adjoining two of said support members having holder holes which are coaxial to each other but having different diameters formed therein.

9. An electroconductive contact probe system, comprising:
an electroconductive contact probe having a first axial end and a second axial end, the probe further comprising an electroconductive coil spring and a first electroconductive contact member disposed on the first axial end, wherein the length of the probe is decreased when a load is applied to the coil spring and wherein each coil spring extends a natural length in an uncompressed state;
a holder member having a first surface and a second surface, the holder member comprising a plurality of layers of support members and a holder hole extending along a thickness of said holder member and an engagement portion;
wherein:
the probe is disposed in the holder hole, and the engagement portion can prevent the probe from sliding out of the holder hole through the first surface; and
the length of the probe when disposed in the holder hole is substantially the same as the length of the probe when no load is applied to the coil such that each electroconductive coil spring extends its natural length if no load is applied to the coil.

10. The electroconductive contact probe system of claim 9, wherein the probe further comprises: 1) a flange portion having a first diameter adjacent the first electroconductive member, and 2) a second electroconductive contact member, wherein the second contact member comprises a needle having a tip portion disposed on the second axial end.

11. The electroconductive contact probe system of claim 10, wherein the engagement portion comprises a shoulder portion that engages the flange portion.

12. The electroconductive contact probe system of claim 10, wherein the first electroconductive contact member has a second diameter, and the engagement portion comprises a hole having a third diameter that is: 1) less than the first diameter, and 2) greater than the second diameter.

13. The electroconductive contact probe system of claim 9, wherein the electroconductive coil spring further comprises a closely wound portion and a coarsely wound portion.

14. The electroconductive contact probe system of claim 9, wherein the engagement portion comprises a shoulder portion defined by a first hole of a first diameter in a first adjoining layer of said plurality of layered support members, and a second hole of a second diameter in a second adjoining layer of said plurality of layered support members.

15. An electroconductive contact probe, comprising:
a holder member comprising at least one layer of a support member defining a plurality of holder holes passed across a thickness of said holder member;
an electroconductive coil spring received in each of said holder holes;
an electroconductive contact member provided on each axial end of said coil spring;
an engagement portion provided in each of said holder holes for preventing one of said contact members from coming off from said holder hole and allowing a certain length of said one contact member projecting out of the corresponding holder hole; and
a circuit board layered on a side of the holder member facing away from the one contact member;
said electroconductive coil springs being installed in said holder holes such that each electroconductive coil spring extends by its natural length under a rest condition of said contact member.

16. An electroconductive contact probe according to claim 15, wherein said contact members on either axial end of each coil spring comprise needle members.

17. An electroconductive contact probe according to claim 16, wherein an engagement portion is provided in only one of two axial ends of each holder hole to prevent the corresponding needle member from coming off from said holder hole.

18. An electroconductive contact probe according to claim 15, wherein said contact member on one of said axial ends of each coil spring comprises a needle member, and the contact member on the other axial end of said coil spring consists of a coil end of said coil spring, said engagement portion being provided in each holder hole only to prevent said needle member from coming off.

19. An electroconductive contact probe according to claim 15, wherein said engagement portion is provided in each of said holder holes for preventing only one of said contact members for each of said coil springs from coming off from said holder hole, and the other contact member is installed substantially flush with the outer surface of the holder member.

20. An electroconductive contact probe according to claim 15, wherein said engagement portion comprises a shoulder defined in each holder hole.

\* \* \* \* \*